(12) United States Patent
Lo Coco et al.

(10) Patent No.: US 6,420,926 B2
(45) Date of Patent: Jul. 16, 2002

(54) CMOS TECHNOLOGY VOLTAGE BOOSTER

(75) Inventors: Luca Lo Coco, Monreale; Maurizio Gaibotti, Cesano Maderno, both of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/738,890

(22) Filed: Dec. 15, 2000

(30) Foreign Application Priority Data

Dec. 17, 1999 (IT) .......................................... MI99A2623

(51) Int. Cl.[7] ................................................ G05F 3/02
(52) U.S. Cl. ...................................... 327/536; 327/537
(58) Field of Search ................................ 327/534, 536, 327/537

(56) References Cited

U.S. PATENT DOCUMENTS

| | | | | |
|---|---|---|---|---|
| 4,460,952 A | * | 7/1984 | Risinger ...................... | 363/61 |
| 4,935,644 A | * | 6/1990 | Tsujimoto ................... | 327/536 |
| 5,335,200 A | * | 8/1994 | Coffman et al. ............ | 327/536 |
| 5,489,870 A | * | 2/1996 | Arakawa ..................... | 327/536 |
| 5,589,793 A | * | 12/1996 | Kassapian ................... | 327/536 |
| 5,821,805 A | * | 10/1998 | Jinbo .......................... | 327/537 |
| 6,100,557 A | * | 8/2000 | Hung et al. ................. | 257/299 |

* cited by examiner

*Primary Examiner*—Terry D. Cunningham
(74) *Attorney, Agent, or Firm*—Lisa K. Jorgenson; E. Russell Tarleton; SEED IP Law Group PLLC

(57) ABSTRACT

A CMOS technology voltage booster having plurality of charge-pump stages cascade connected together and driven by a plurality of phases, each stage having a terminating input node and a terminating output node, with at least one transistor connected therebetween that has its control terminal connected to an internal circuit node of the same stage and applied one of the phases. This voltage booster further includes a pair of additional circuit elements for transferring, onto the internal node, a potential exceeding the voltage at the input node by at least one threshold. A first of the additional elements is essentially a MOS transistor having its control terminal connected to the control terminal of that transistor that is connected between the input and the output of the stage, while the second additional element is an auxiliary capacitor having one end connected directly to the first additional element and connected to the internal node through a transistor.

8 Claims, 7 Drawing Sheets

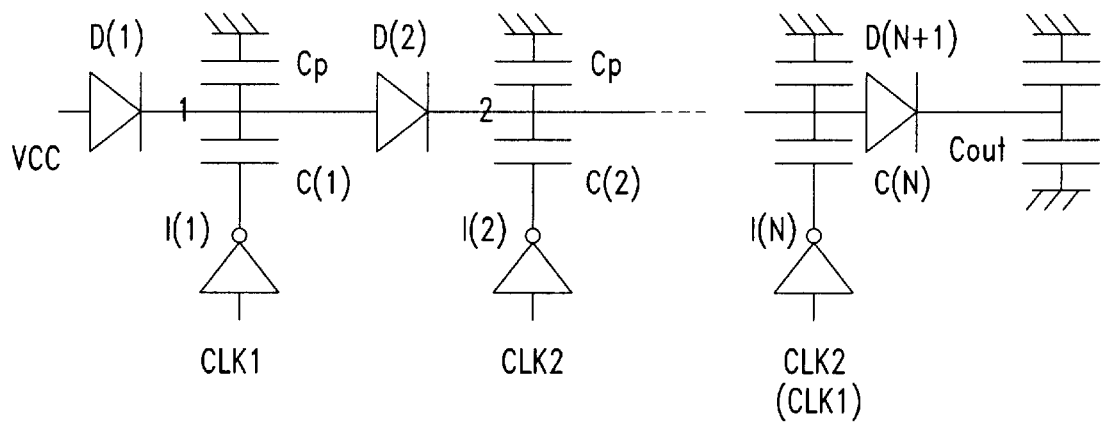
Fig. 1
*(Prior Art)*
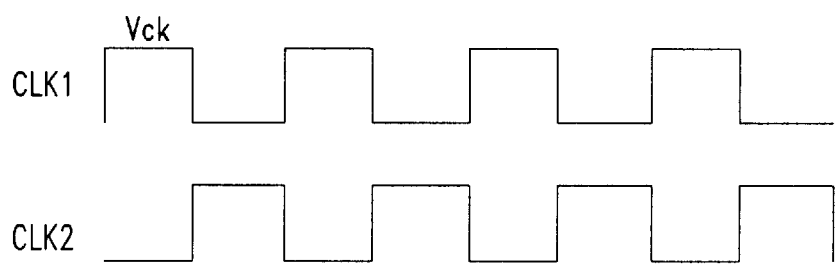
Fig. 1/A
*(Prior Art)*

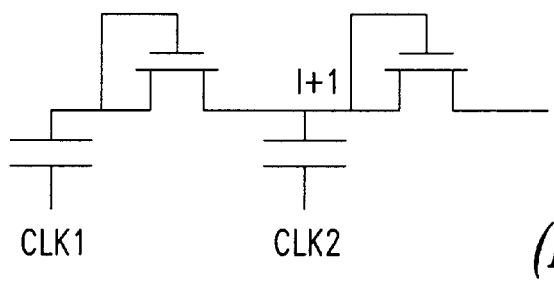
*Fig. 2*
*(Prior Art)*
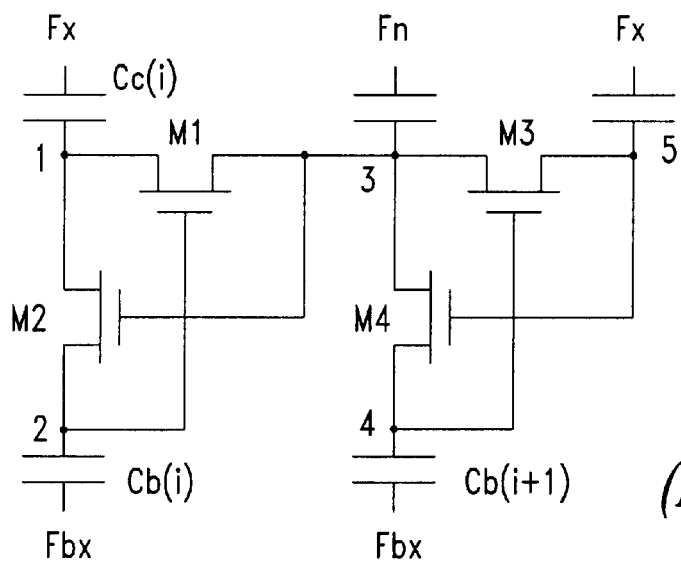
*Fig. 3*
*(Prior Art)*
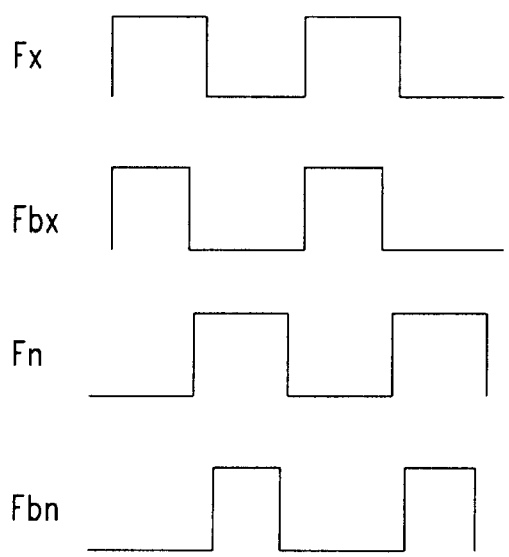
*Fig. 3/A*
*(Prior Art)*

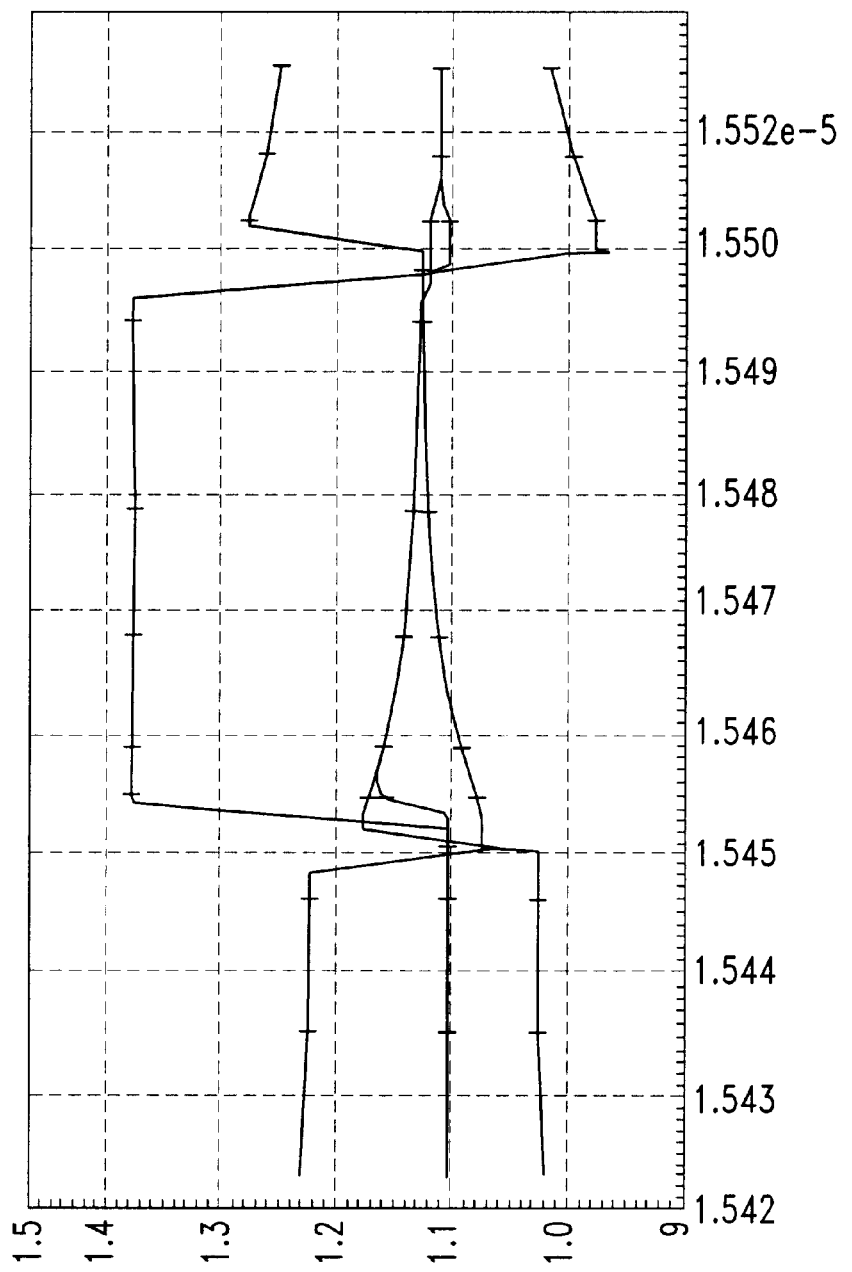
Fig. 6/A

US 6,420,926 B2

CMOS TECHNOLOGY VOLTAGE BOOSTER

TECHNICAL FIELD

This invention relates to a CMOS technology voltage booster, and more particularly but not exclusively, to a novel voltage booster comprising NMOS transistors and being adapted for operation on specially low voltages in the range of 1V.

Specifically, the disclosed embodiment of the invention relates to a voltage booster as above that includes a plurality of charge-pump stages cascade-connected together and driven by a plurality of phases, each stage having a terminating input node and a terminating output node with at least one transistor connected therebetween which has its control terminal connected to an internal circuit node of the same stage and applied to one of the phases.

BACKGROUND OF THE INVENTION

Voltage boosters are extensively utilized in non-volatile memory devices, such as EEPROMs and Flash EEPROMs, to generate a voltage Vp needed for the device program phase. These voltage boosters include circuit portions of a kind known as charge pumps.

The circuit architectures more frequently employed to provide voltage boosters for memories are based essentially on a Dickson charge pump, shown diagrammatically in FIG. 1.

The principle of operating such a charge pump will be briefly reviewed herein below, which assumes an initial state of the control signal CLK1 to be 0 and the signal CLK2, in phase opposition with the former, to be a voltage value Vck, as shown in FIG. 1A.

In these conditions, the capacitor C(1) is in a charged state at a voltage Vcc−Vth(D1). When CLK1 has a leading edge at Vck, the node 1 will attain a voltage Vcc+Vck−Vth(D1), since the voltage across the capacitor cannot change instantaneously. Thus, the diode D(2) begins to conduct and the capacitor C(1) transfers charge into the capacitor C(2).

When the signal CLK1 goes back to 0 and the other signal CLK2 rises to Vck, the diode D(1) is reverse biased and prevents the charge transferred into C(2) from flowing back, while the diode D(2) allows the charge to pass from the capacitor C(2) to the capacitor C(3). This process is iterated at all the stages.

In CMOS circuits, the diode is usually in the form of an N-channel transistor having a low threshold voltage and being diode-connected.

Shown diagrammatically in FIG. 2 are two contiguous stages of a conventional CMOS technology voltage booster.

With the charge pump delivering current, the output voltage is given generally as:

$$Vout = Vcc - Vth(1) + \Sigma[Vck' - Vth(i) - Iout/f(C+CP)]$$

where:

Cp is the parasitic capacitance of a node;

Vth(i) is the body-effect threshold voltage of the ith transistor;

Vck' corresponds to Vck*C/(C+Cp);

Iout is the current supplied by the charge pump to the load; and f is the clock frequency.

A major limitation comes to a pump of this type from the threshold loss that is incurred at each stage. This limitation is emphasized by the body effect of the transistor. To overcome the threshold loss problem, the prior art provides a four-phase circuit architecture, shown in FIG. 3.

The operation of the circuit of FIG. 3 will be explained with the aid of a phase plot, shown schematically in FIG. 3A.

Assume an initial state of the voltage V1 at the node 1 to be the same as the voltage V2 at the node 2. The first phase Fx is brought to a high value, raising the voltage V1 at the node 1 by a value Fx' equal to Fx*Cc/(Cc+Cpar).

The nodes 2 and 3 are unchanged because the transistors M1 and M2 are in their 'off' state. The second phase Fbx goes high, somewhat delayed on the first phase Fx, thereby raising the voltage V2 at the node 2 by a value Fbx' equal to Fbx*Cb/(Cb+Cpar').

If this voltage Fbx' is higher than the threshold voltage of the transistor M2, the charge stored in the capacitor Cc(i) can be transferred into the capacitor Cc(i+1). Therefore, the second phase Fbx goes back to zero causing the transistor M1 to be turned off, so that no charge backflow will occur as the first phase Fx also goes back to zero after a delay.

At this point, the process is iterated at the following stages.

It should be noted that when the third phase Fn goes high, the transistor M2 is turned on to short the nodes 1 and 2. In this condition, the transistor M2 becomes diode connected. It should be noted that the capacitance Cb is very small, being approximately one twentieth the capacitance Ce; accordingly, the loss of charge incurred by shorting the nodes 1 and 2 will be trivial.

With this circuit design, a threshold loss at every stage is no longer experienced. However, at low supply voltages, or with transistors exhibiting a high body effect, the circuit performance is bound to deteriorate considerably.

In fact, the voltage Fbx(Fbn) may no longer suffice to turn on the horizontal pass transistor (M1/M3) which allows a charge transfer to occur between the capacitors Cc.

The underlying technical problem of this invention, is to provide a novel voltage booster structure with appropriate structural and functional features to have a higher voltage level transferred more efficiently, as well as to overcome the aforementioned limitations of the prior art.

SUMMARY OF THE INVENTION

The principle on which the disclosed embodiment of this invention stands is to arrange for a transfer of boosted voltage to occur between intermediate stages of the voltage booster, with a first transfer being the equal of one transistor threshold. In this way, the gate of the pass transistor between any two stages can be at the same voltage as the drain voltage only during the phase when said pass transistor is not to transfer charge between the two stages. This may be regarded as being the equivalent of an increase, over the prior art, in the gate voltage of the pass transistor equal to a transistor threshold voltage.

Based on this principle, the technical problem is solved by a voltage booster that includes a pair of additional circuit elements for transferring, onto said internal node, a potential exceeding the voltage at said input node by at least one threshold.

A first circuit element is essentially a MOS transistor having its control terminal connected to the control terminal of said pass transistor, and the second additional circuit element is an auxiliary capacitor having one end connected to a terminal of the first additional element.

The features and advantages of a voltage booster according to the invention will be apparent from the following description of an embodiment thereof, given by way of non-limitative example with reference to the accompanying drawings.

BRIEF DESCRIPTION OF THE DRAWINGS

FIGS. 1 and 1A show schematically a charge-pump voltage booster having a plurality of voltage boosting stages cascade connected together and associated clock signals, according to the prior art.

FIG. 2 shows schematically two contiguous stages of a conventional CMOS technology voltage booster.

FIG. 3 shows schematically a conventional voltage booster having a pair of charge pump stages connected into a four-phase architecture.

FIG. 3A is a very schematic plot of four timing signals vs. time, in the voltage booster of FIG. 3.

FIG. 6A is a plot of voltage vs. time showing voltage signals susceptible to appear in a voltage booster according to the invention.

DETAILED DESCRIPTION OF THE INVENTION

Figure 4:
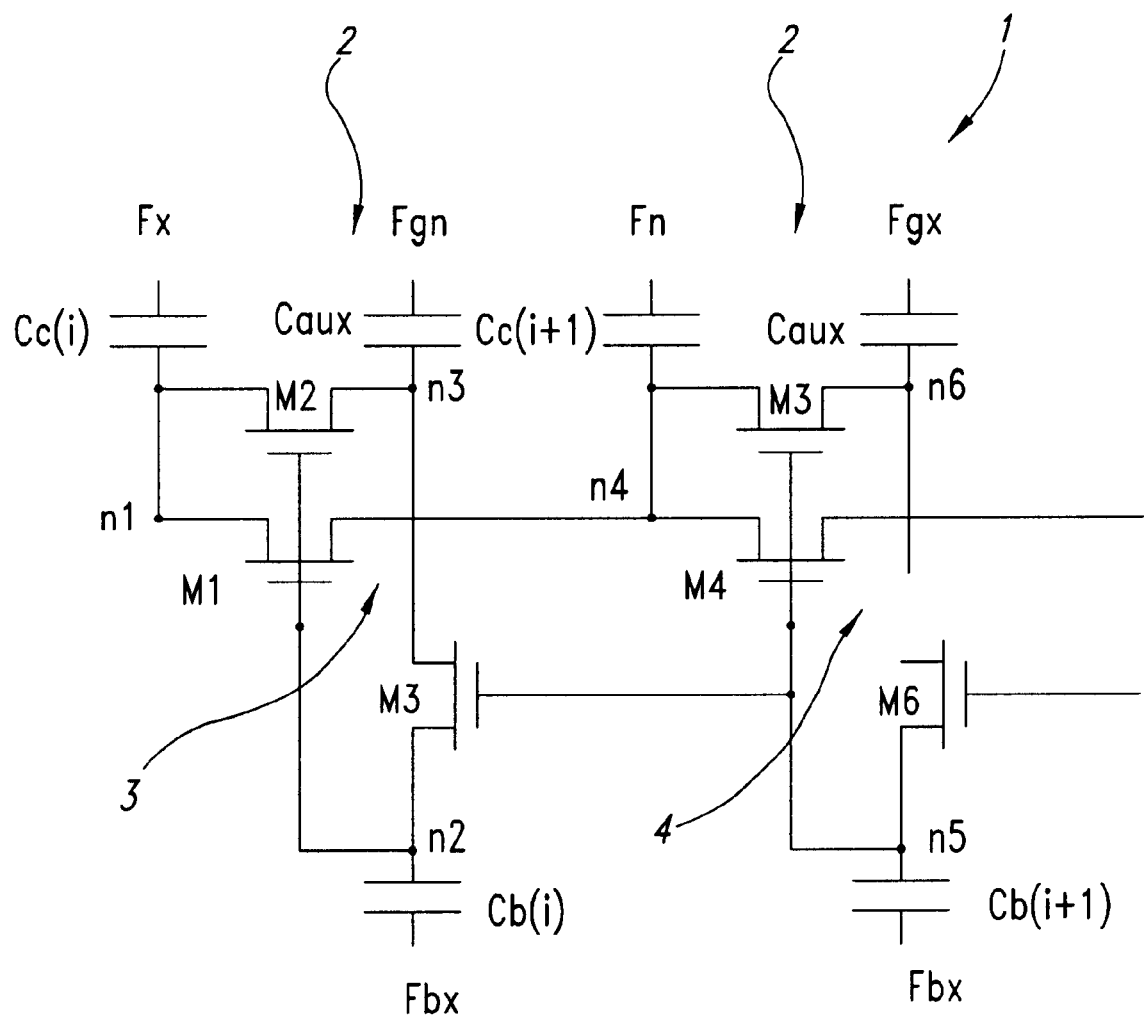
FIG. 4 shows schematically a voltage booster comprising a plurality of cascade-connected stages, according to an embodiment of the invention.

With reference in particular to FIG. 4 of the drawings, a voltage booster embodying this invention is shown generally at 1 in schematic form.

The voltage booster 1 is preferably formed with CMOS technology and lends itself especially for integration in semiconductor integrated storage devices, e.g., single power supply devices requiring that boosted voltages, such as the program voltage for the memory cells, be generated inside the devices. However, the voltage booster of this invention may be used in other circuits types for different purposes.

The voltage booster 1 comprises a plurality of voltage booster stages or charge-pump stages 2, connected together in cascade.

Each stage 2 has an input circuit node and an output circuit node, and has a pair of intermediate nodes to be described. The output node is coincident with the input node of a next stage, excepting the first and last stages in the cascade.

The voltage booster 1 comprises at least a pair of interconnected stages 2. A first stage 3 has an input node n1 and an output node n4. The stage 3 could also be a ith stage of the stage chain.

Connected between the input node n1 and the output node n4 is a MOS transistor M1 that is essentially a pass transistor having a first conduction terminal connected to the input node n1, a second conduction terminal connected to the output node n4, and a control terminal connected to an intermediate node n2.

The input node n1 is delivered a first phase signal Fx through a first capacitor Cc(i). The intermediate node n2 is delivered a second phase signal Fbx through a second capacitor Cb(i).

The first stage 3 has an almost identically formed second stage 4 connected to it. As said before, the output node n4 of the first stage 2 corresponds to and is coupled with the input node of the second stage 4.

A MOS transistor M4 connects the input node n4 of the second stage 4 to an output node of the second stage 4. A phase Fn is applied to the node n4 through a capacitor Cc(i+1) corresponding essentially to the capacitor Cc(i) of the first or ith stage 3.

The control terminal of the transistor M4 is connected to an internal node n5 of the second stage which has the same construction as the node n2 of the first stage 3.

A phase Fbn is applied to the internal node n5 through a capacitor CB(i+1) corresponding essentially to the capacitor Cb(i) of the first or ith stage 3.

Connected between the internal nodes n2 and n5 is a MOS transistor M3 having one conduction terminal connected to the node n2 of stage 3 and a control terminal connected to the node n5 of stage 4.

The other conduction terminal of the transistor M3 is coincident with a further internal circuit node n3.

Advantageously in this invention, a MOS transistor M2 is placed between the input node n1 and the further internal node n3, with its conduction terminals connected to the node n1 and the node n3, respectively. The transistor M2 function is essentially that of a pass transistor.

The control terminal of the transistor M2 is connected to the control terminal of the transistor M1. The transistor M2 is preferably much more conductive than the transistor M1.

In addition, a phase Fgn is applied to the internal node n3 through an auxiliary capacitor Caux. The auxiliary capacitor Caux is quite small, so that its charging transient can be quite fast.

A transistor M5 connected between the input node n4 and an internal circuit node n6 corresponds to the transistor M2 in the stage 4 structure.

The transistor M5 also functions essentially as a pass transistor.

A phase Fgx is applied to the internal node n6 through a capacitor Caux which corresponds essentially to the capacitor Caux of the first or ith stage 3.

Provided between the internal nodes n5 and n6 of the second stage 4 is a transistor M6, which has its conduction terminals connected to a respective one of the internal nodes n5, n6, and has the control terminal connected to an internal node of any other stage ranking (i+2) and connected downstream of the stage 4.

The phases Fx, Fn, Fbx, Fbn are in the same time relationship as shown in FIG. 3A.

The signal Fgn is in phase with the signal Fn, and may be either the signal Fn itself, or the signal Fbn, or ground.

The signal Fgx is in phase with the signal Fx, and may be either the signal Fx itself, or the signal Fbx, or ground.

In the event that no much higher voltages are required at the gate than at the drain of the pass transistor, the phases Fgn(Fgx) can be shorted to ground.

Briefly, the voltage booster of this invention operates as outlined herein below.

When the phase Fbx is present, both transistors M1 and M2 are conducting, and the auxiliary capacitor Caux is charged to the same potential as the output node n4.

Current is flowed from the node n1 to the node n3 and then the node n2. The node 2 becomes charged at a consistent voltage with MOS technology. In essence, the internal node n2 is raised to a voltage that is by the threshold of a diode (or a diode-connected transistor) higher than the voltage at the node n1. The chain of charge-pump elements will act to boost the input voltage from the node n1 to the node n4. Subsequently to this, upon the input stage being turned off, the transfer of potential will take place from the node n4 to the node n6.

With continued reference to the phase graph of FIG. 3A, the circuit operation can be described in greater detail as follows. Assume that the voltage V2 at the node n2 is initially the same as the voltage V1 at node n1 plus one threshold Vth(M2) of the transistor M2.

The phase Fx goes high, raising the voltage V1 at the node n1 by a value Fx' (=Fx*Cc)/(Cc+Cpar)).

The nodes n2 and n4 undergo no changes because the transistors M1 and M3 are 'off.' The phase Fbx goes high after a delay from Fx, raising the voltage V2 at the node n2 by a value Fbx' (=Fbx*Cb1/(Cb+Cpar')). This voltage causes the pass transistors M1 and M2 to become at once conductive. Thereupon, the charge stored in the capacitor Cc(i) can be transferred into the capacitor Cc(i+1) and the auxiliary capacitor Caux.

The capacitance of Caux is trivial (1/100) compared to Cc(i), and therefore, the charge transferred into Caux reduces the charge transferred into Cc(i+1) by a negligible amount.

Accordingly, the phase Fbx will go back to zero, turning off the transistors M1 and M2, while the phase Fx goes back to zero, decreasing the value at the node n1 by the value of Fx and leaving the nodes n3 and n4 unchanged.

At this point, the cycle is iterated for phases Fn and Fbn.

It should be noted that as the phase Fbn goes high, the transistor M3 is caused to conduct. The auxiliary capacitor Caux will be discharged into the capacitor Cb(i), and the node n2 allowed to attain the maximum value of V1+Vth (M2). In this condition, the transistor M2 is indeed diode connected, so that the voltage V2 at the node n2 (and the node N3) cannot exceed the value of V1+Vth(M2).

Advisably, the transistor M2 should have a lower threshold voltage than M1 so that, while the node n2 is being charged, it does not enter conduction and cause charge to be flowed back to the capacitor Cc from the capacitor C(i+1). For this reason, the transistor M2 should be selected more conductive than the transistor M1.

Figure 5:
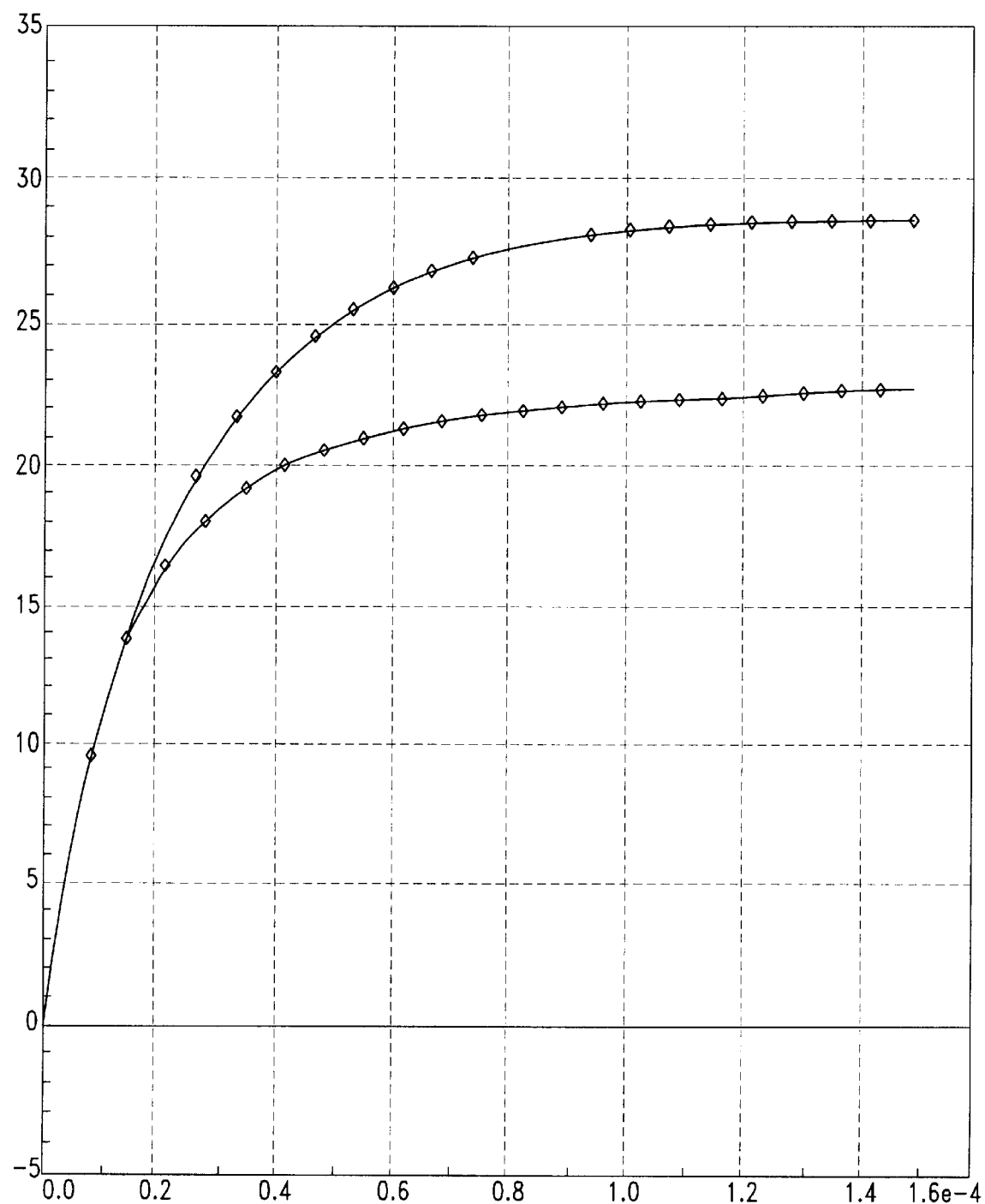
FIG. 5 are comparative plots of voltage vs. time, showing the voltage rise in the inventive and the conventional voltage booster.

Shown in FIG. 5 is a comparative graph of voltage vs. time, which shows the voltage rise curve (top curve) of the voltage booster according to the invention, and that of a conventional voltage booster.

Figure 6:
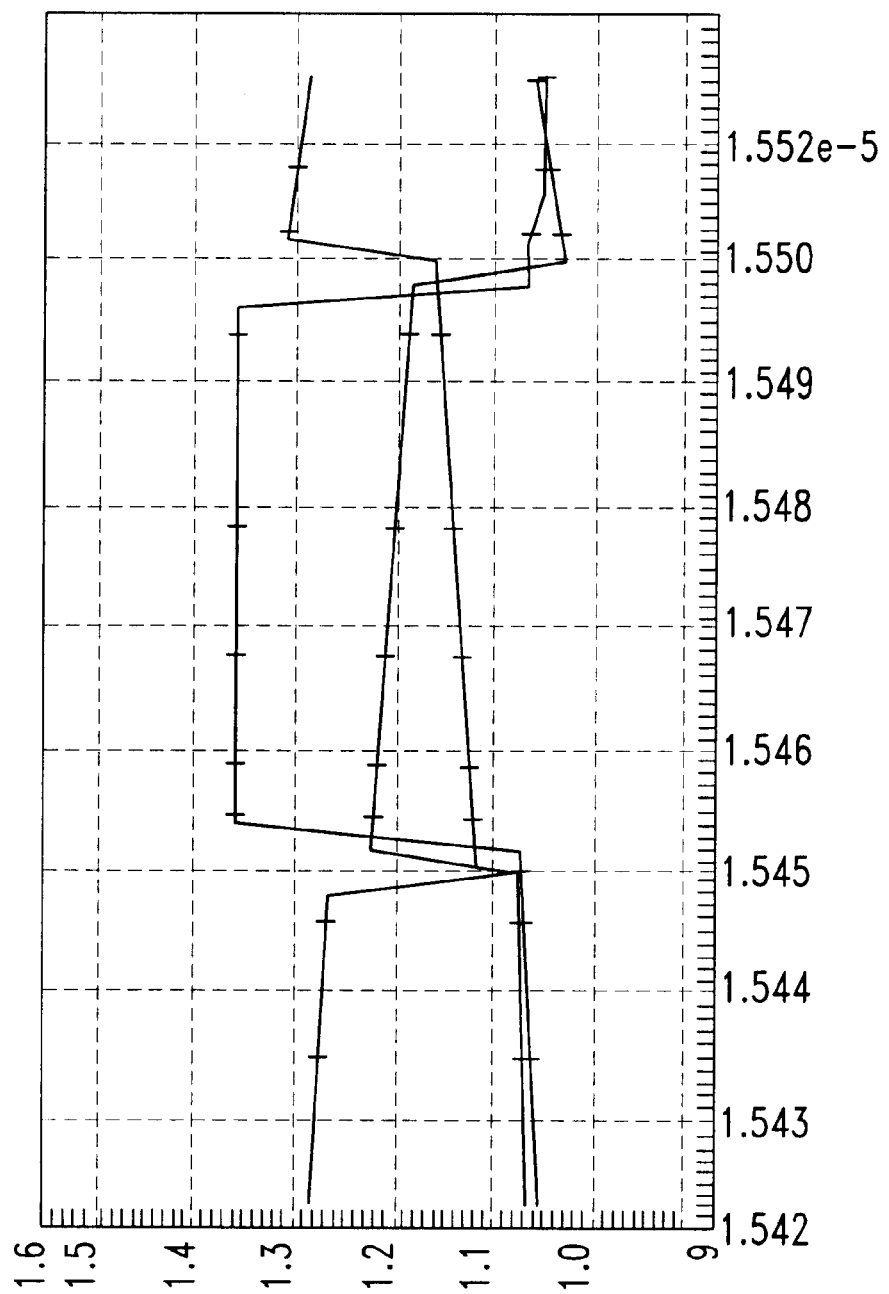
FIG. 6 is a plot of voltage vs. time showing the pattern of the gate, drain and source voltages of the transfer transistor in a generic stage of a conventional voltage booster.

The plot of voltage vs. time shown in FIG. 6 shows the patterns of some voltage signals in a charge-pump voltage booster having eighteen cascaded stages, according to the prior art.

FIG. 6A shows instead the patterns of some signals in, and the value reached by the output voltage of, a charge-pump voltage booster having eighteen cascaded stages, according to this invention.

The operating conditions of the simulation that yielded the graphs of FIGS. 6 and 6A were the following;

T=25° C.;
Supply voltage=1.5V;
Fx=Fn=1.5V;
Fbx=Fbn=3V;
FGn=FGx=0V.

The pass transistors of equal size (W=20$\mu$; L=2$\mu$) had a threshold voltage Vth of 0.25V and a body-effect coefficient Kbe of 0.35.

Figure 7:
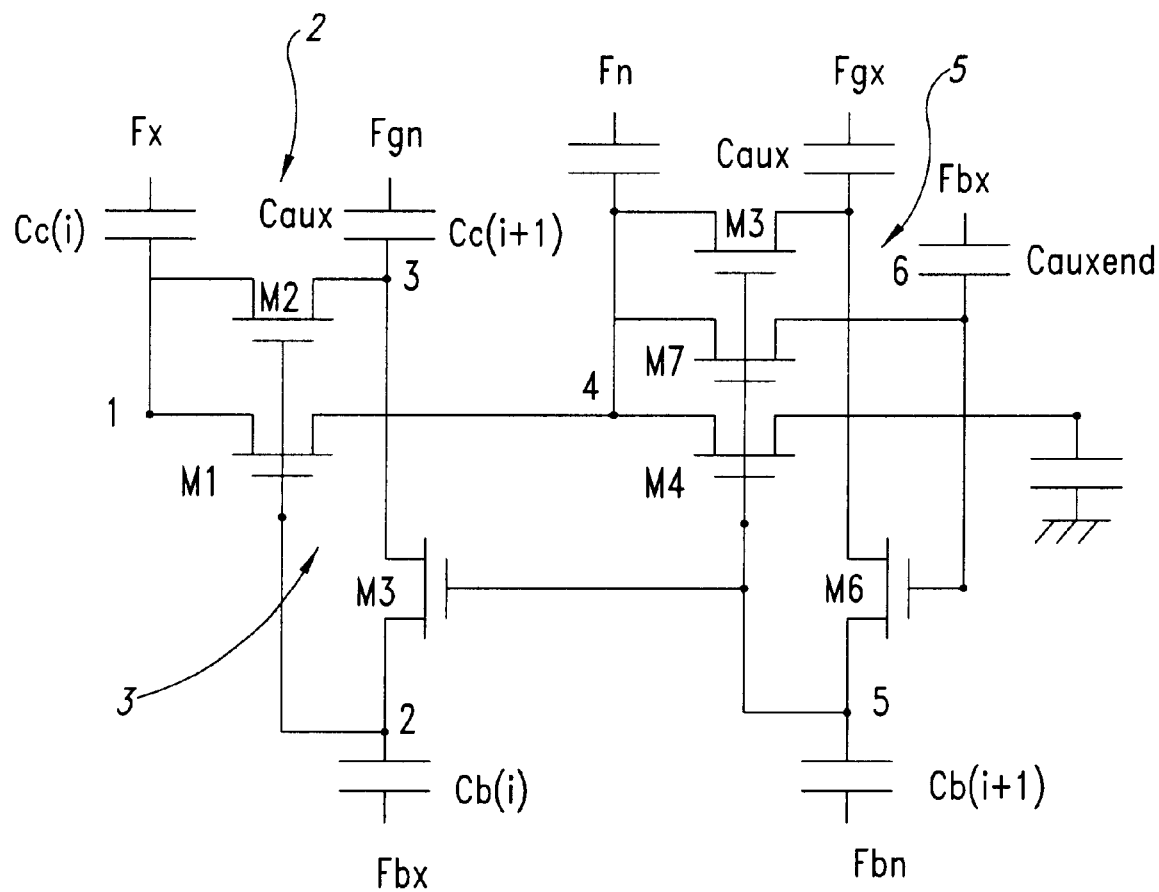
FIG. 7 shows schematically a final stage of the chain of cascade-connected stages in the voltage booster of the invention.

The last stage 5 in the voltage booster of this invention is shown diagrammatically in FIG. 7, and is a slightly different construction from that of a ith intermediate stage. In particular, a transistor M7 is additionally provided therein which has its conduction terminals connected between the node n4 and the node n6, and has its control terminal connected to the control terminals of the transistors M4 and M5.

This novel architecture does overcome the limitations of prior four-phase architectures. In fact, with the four-phase architecture according to the invention, the maximum value of the gate voltage of the pass transistors is limited by the voltage value of the diode connection of the transistor M2.

Although a representative embodiment has been illustrated and described, it is to be understood that various changes can be made without departing from the scope of the invention. Hence, the invention is to be limited only by the scope of the appended claims and the equivalents thereof.

What is claimed is:

1. A voltage booster, comprising a plurality of charge-pump stages cascade connected together and driven by a plurality of phases, each charge-pump stage having a terminating input node and a terminating output node, with at least one pass transistor connected there between that has its control terminal connected to an internal circuit node of the same stage and applied to one of the phases, and further comprising a second transistor having its control terminal connected to a control terminal of said at least one pass transistor, a first terminal coupled to the input node and a second terminal coupled to an auxiliary capacitor that is coupled to another one of the phases, the second transistor configured to have a conductivity greater than a conductivity of the at least one pass transistor; each stage further comprising a third transistor coupled between the second terminal of the second transistor and to the one of the phases via a further capacitor and having a control terminal configured to be coupled to a succeeding stage.

2. The voltage booster of claim 1, wherein each stage comprises an additional capacitor connected between the terminating input node and a further one of the phases.

3. A charge-pump stage comprising:

a first capacitor coupled between a first phase signal source and an input node;

a first transistor having a first terminal coupled to the input node, a second terminal coupled to an output node, and a control terminal;

a second capacitor coupled to a second phase signal source and to the control terminal of the first transistor at an internal node;

a second transistor having a first terminal coupled to the input terminal, a second terminal coupled to a third phase signal source, and a control terminal coupled to the control terminal of the first transistor;

an auxiliary capacitor connected between the second terminal of the second transistor and the third phase signal source; and a third transistor having a first terminal coupled to the auxiliary capacitor, a second terminal coupled to the control terminal of the first transistor at the first internal node, and a control terminal configured to be coupled to an external node, the auxiliary capacitor and the third transistor configured to transfer a voltage potential to the internal node that exceeds the voltage at the input node by at least one threshold.

4. A voltage booster, comprising:
a plurality of charge-pump stages cascade connected together and driven by a plurality of phase signals, each charge-pump stage comprising:
   a first capacitor coupled between a first phase signal source and an input node;
   a first transistor having a first terminal coupled to the input node, a second terminal coupled to an output node, and a control terminal;
   a second capacitor coupled to a second phase signal source and to the control terminal of the first transistor at an internal node;
   a second transistor having a first terminal coupled to the input terminal, a second terminal coupled to a third phase signal source, and a control terminal coupled to the control terminal of the first transistor;
   an auxiliary capacitor connected between the second terminal of the second transistor and the third phase signal source; and
   a third transistor having a first terminal coupled to the auxiliary capacitor, a second terminal coupled to the control terminal of the first transistor at the first internal node, and a control terminal configured to be coupled to the internal node of the next subsequent stage.

5. The voltage booster of claim 4, wherein each charge-pump stage is configured to transfer a voltage potential to the internal node of that stage that exceeds the voltage at the input node.

6. The voltage booster of claim 5, wherein the voltage potential transferred to the internal node of a stage exceeds the voltage at the input node of that stage by at least one threshold.

7. The voltage booster of claim 6, wherein one of the plurality of charge-pump stages comprises a final charge-pump stage that comprises a fourth transistor having a first terminal coupled to the input node, a second terminal coupled to the control terminal of the third transistor that in turn is coupled to a fourth phase signal source via a second auxiliary capacitor, and a control terminal coupled to the internal node.

8. A voltage booster, comprising:
at least one charge-pump stage followed by a final stage, each of the at least one charge-pump stages and the final stage driven by a plurality of phase signals, each charge-pump stage and final stage comprising:
   a first capacitor coupled between a first phase signal source and an input node;
   a first transistor having a first terminal coupled to the input node, a second terminal coupled to an output node, and a control terminal;
   a second capacitor coupled to a second phase signal source and to the control terminal of the first transistor at an internal node;
   a second transistor having a first terminal coupled to the input terminal, a second terminal coupled to a third phase signal source, and a control terminal coupled to the control terminal of the first transistor;
   an auxiliary capacitor coupled between the second terminal of the second transistor and third phase signal source;
   a third transistor having a first terminal coupled to the auxiliary capacitor, a second terminal coupled to the control terminal of the first transistor at the first internal node, and a control terminal configured to be coupled to the internal node of a subsequent stage;
   the final stage further comprising a fourth transistor having a first terminal coupled to the input node, a second terminal coupled to the control terminal of the third transistor that in turn is coupled to a fourth phase signal source via a second auxiliary capacitor, and a control terminal coupled to the internal node.

* * * * *